United States Patent
Yamaguchi et al.

(10) Patent No.: US 6,492,720 B1
(45) Date of Patent: Dec. 10, 2002

(54) FLAT-TYPE SEMICONDUCTOR STACK

(75) Inventors: Hiroaki Yamaguchi, Tokyo (JP); Yasuhito Shimomura, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 10/002,163

(22) Filed: Dec. 5, 2001

(30) Foreign Application Priority Data

Jun. 6, 2001 (JP) ........................................ 2001-170351

(51) Int. Cl.⁷ .............................................. H01L 23/02
(52) U.S. Cl. ....................... 257/686; 257/712; 257/797; 257/723; 257/727; 257/785
(58) Field of Search ................................ 257/685, 686, 257/697, 712, 717, 773, 774, 797, 723, 718, 719, 726, 727, 707, 730, 785

(56) References Cited

U.S. PATENT DOCUMENTS

| | | | | |
|---|---|---|---|---|
| 4,226,281 A | * | 10/1980 | Chu ............................ | 165/185 |
| 4,235,283 A | * | 11/1980 | Gupta ........................ | 165/185 |
| 4,830,456 A | * | 5/1989 | Kakii et al. .................... | 385/59 |
| 5,348,214 A | * | 9/1994 | Nishiguchi et al. ...... | 228/180.22 |
| 5,514,852 A | * | 5/1996 | Takamori et al. ......... | 219/388 |
| 5,661,639 A | * | 8/1997 | Furuno et al. .............. | 165/185 |
| 5,684,675 A | * | 11/1997 | Taniguchi et al. ......... | 174/52.1 |
| 5,811,877 A | * | 9/1998 | Miyano et al. ............. | 257/669 |
| 5,834,843 A | * | 11/1998 | Mori et al. ................. | 257/685 |
| 5,898,575 A | * | 4/1999 | Hawthorne et al. ..... | 174/138 G |
| 6,005,290 A | * | 12/1999 | Akram et al. .............. | 257/684 |
| 6,115,242 A | * | 9/2000 | Lambrecht .................. | 257/686 |
| 6,166,437 A | * | 12/2000 | Dhong et al. .............. | 257/665 |
| 6,188,127 B1 | * | 2/2001 | Senba et al. ............... | 257/685 |
| 6,226,776 B1 | * | 5/2001 | Panchul et al. ............ | 716/18 |
| 6,353,264 B1 | * | 3/2002 | Coronel et al. ............ | 257/432 |
| 6,404,048 B2 | * | 6/2002 | Akram ....................... | 174/252 |
| 2002/0024798 A1 | * | 2/2002 | Moden et al. .............. | 361/719 |

FOREIGN PATENT DOCUMENTS

| | | | | |
|---|---|---|---|---|
| JP | 60-207359 | | 10/1985 | |
| JP | 1-174945 | | 7/1989 | |
| JP | 2-68451 | | 3/1990 | |
| JP | 05235220 A | * | 9/1993 | ........... H01L/23/40 |
| JP | 05291445 A | * | 11/1993 | ........... H01L/23/40 |

* cited by examiner

*Primary Examiner*—Nathan J. Flynn
*Assistant Examiner*—Pershelle Greene
(74) *Attorney, Agent, or Firm*—Sughrue Mion, PLLC (57) ABSTRACT

In a flat-type semiconductor stack formed by alternately stacking flat-type semiconductor devices (1) and heat-radiating elements (2), a projecting pin (7) is provided on a contact surface of at least one flat-type semiconductor device (1) while a positioning recess (8a) and a guide groove (8) are formed in a contact surface of at least one heat-radiating element (2), the guide groove (8) extending directly from the positioning recess (8a) to a side surface of the heat-radiating element (2). The flat-type semiconductor device (1) is aligned with the heat-radiating element (2) by fitting the pin (7) in the guide groove (8) and sliding the pin (7) along the guide groove (8) until the pin (7) stops to slide at the positioning recess (8a).

8 Claims, 5 Drawing Sheets

FLAT-TYPE SEMICONDUCTOR STACK

BACKGROUND OF THE INVENTION AND RELATED ART STATEMENT

The present invention pertains generally to semiconductor power converters using flat-type semiconductor devices and, more particularly, relates to flat-type semiconductor stacks formed of alternately stacked flat-type semiconductor devices and heat-radiating elements.

Generally, a flat-type semiconductor stack used in a semiconductor power converter is made by alternately stacking layers of flat-type semiconductor devices, such as gate commutated turn-off thyristors (GCTs), and heat-radiating elements, such as heat sinks, for cooling the flat-type semiconductor devices, and pressurizing the layers in their stacking direction.

As a result of an increase in capacity in recent years, the flat-type semiconductor stacks tend to have larger outside dimensions and produce increased amounts of heat to be absorbed and dissipated, making it necessary to increase the physical size of their heat-radiating elements. Today, the flat-type semiconductor stacks are of greater importance to industrial applications. In this situation, there is a growing demand these days for power converters having a compact structure produced by alternately stacking multiple layers of flat-type semiconductor devices.

In a flat-type semiconductor stack produced by stacking multiple layers of large-sized flat-type semiconductor devices and heat-radiating elements, it is important to accurately match the center of each flat-type semiconductor device when assembling them or replacing any of the flat-type semiconductor devices.

Gate-integrated flat-type semiconductor devices featuring improved performance integrated with gate circuits have become available in recent years. This results in an increase in the weight of the flat-type semiconductor devices and makes it necessary to match their centers more accurately.

Figure 7:
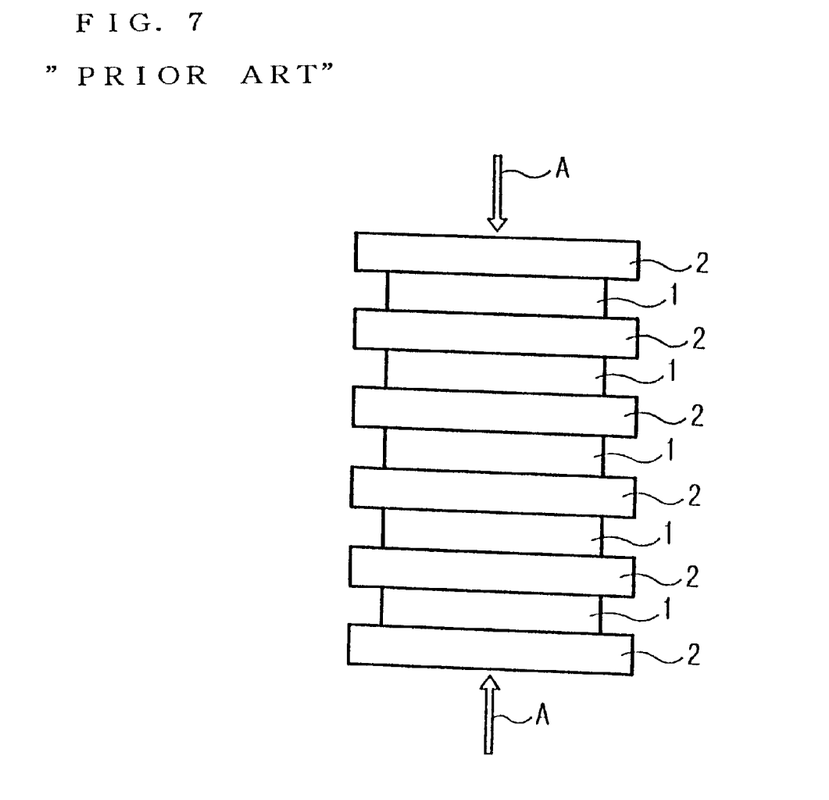
FIG. 7 is a side view of a conventional flat-type semiconductor stack showing in particular how its individual elements are stacked.

FIG. 7 is a side view of a conventional flat-type semiconductor stack showing in particular how its individual elements are stacked. As can be seen from FIG. 7, specific numbers of flat-type semiconductor devices 1 and heat-radiating elements 2 for cooling the flat-type semiconductor devices 1 are alternately stacked, and these devices 1 and elements 2 are pressurized from both ends in their stacking direction.

Figure 8:
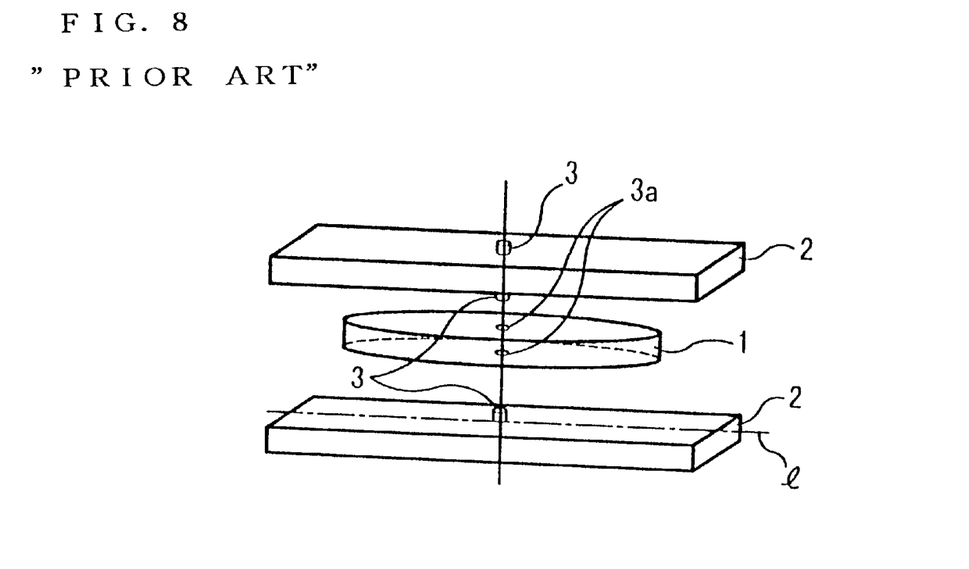
FIG. 8 is a perspective view showing a mechanism for aligning flat-type semiconductor devices and heat-radiating elements of the conventional flat-type semiconductor stack.

FIG. 8 is a perspective view showing how the flat-type semiconductor devices 1 and the heat-radiating elements 2 of the flat-type semiconductor stack are aligned.

Referring to FIG. 8, a positioning hole 3a is formed at the center of each contact surface of the flat-type semiconductor device 1, whereas a projecting center pin 3 is fixed to each contact surface of the heat-radiating elements 2 at a position corresponding to the positioning hole 3a. When stacking the flat-type semiconductor devices 1 and the heat-radiating elements 2, they are accurately aligned as each center pin 3 is inserted into the corresponding positioning hole 3a.

Figure 9:
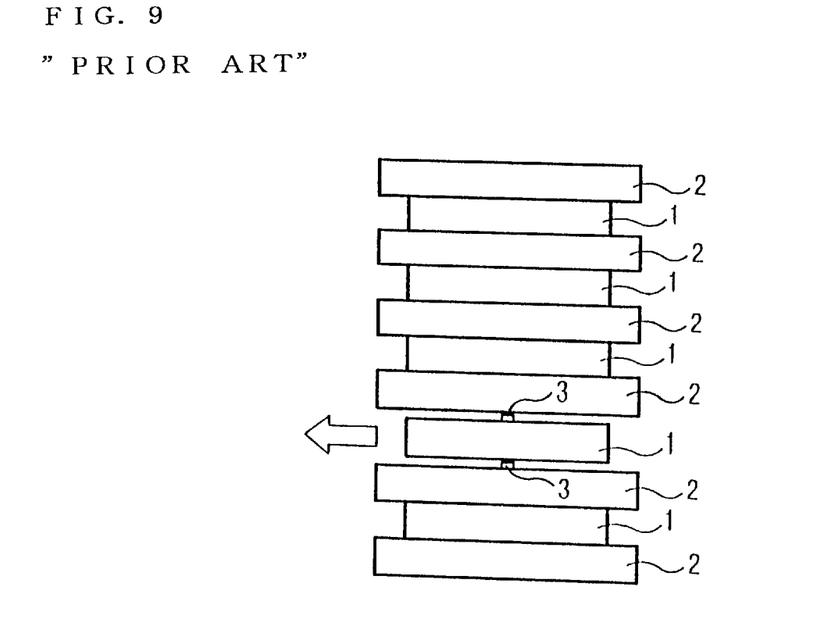
FIG. 9 is a side view showing how a flat-type semiconductor device of the conventional flat-type semiconductor stack is replaced.

When it becomes necessary to replace one flat-type semiconductor device 1 of this flat-type semiconductor stack upon completion of its assembly, the adjacent heat-radiating elements 2 are separated from the flat-type semiconductor device 1, creating gaps wider than the height of the center pins 3 as shown in FIG. 9. Then, the flat-type semiconductor device 1 is lifted and pulled out in a manner that the center pins 3 would not damage the flat-type semiconductor device 1. When fitting a new flat-type semiconductor device 1, it is lifted and positioned such that the center pins 3 of the adjacent heat-radiating elements 2 exactly align with the positioning holes 3a in the flat-type semiconductor device 1 with utmost care not to damage the new flat-type semiconductor device 1 by the center pins 3. Then, the center pins 3 are fitted into the positioning holes 3a until the gaps between the flat-type semiconductor device 1 and the heat-radiating elements 2 are eliminated.

Figure 10:
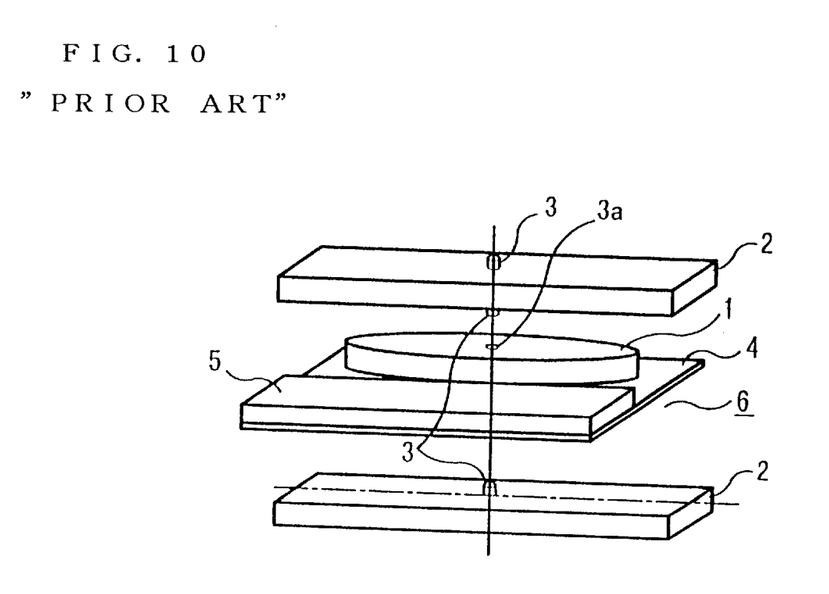
FIG. 10 is an exploded perspective view showing a mechanism for aligning a gate-integrated flat-type semiconductor device and heat-radiating elements of a conventional flat-type semiconductor stack.

FIG. 10 is an exploded perspective view of a flat-type semiconductor stack including a gate-integrated flat-type semiconductor device 6 formed by mounting a flat-type semiconductor device 1 and a gate circuit 5 on a single substrate 4, wherein the gate-integrated flat-type semiconductor device 6 and heat-radiating elements 2 are aligned using the aforementioned conventional positioning method shown in FIG. 8. In this example of the prior art, the gate-integrated flat-type semiconductor device 6 and the upper heat-radiating element 2 are aligned by inserting a center pin 3 projectingly fixed to a bottom contact surface of the upper heat-radiating element 2 into a positioning hole 3a formed in a top contact surface of the gate-integrated flat-type semiconductor device 6 in the same manner as shown in FIG. 8.

In this flat-type semiconductor stack, another positioning hole 3a is formed in a bottom surface of the substrate 4 (bottom side of the substrate 4 as illustrated in FIG. 10) that is joined to the lower heat-radiating element 2.

Since the flat-type semiconductor devices 1 and the heat-radiating elements 2 are aligned in the aforementioned manner in the conventional flat-type semiconductor stacks, it is necessary to create gaps wider than the height of the center pins 3 between one flat-type semiconductor device 1 to be replaced and its adjacent heat-radiating elements 2. It is therefore necessary to provide sufficient space allowance between the flat-type semiconductor device 1 and the adjacent heat-radiating elements 2 that enables the heat-radiating elements 2 to be moved in their stacking direction for making gaps wider than the height of the center pins 3. This tended to make the construction of the flat-type semiconductor stacks complicated.

Also in the conventional flat-type semiconductor stacks, it is necessary to lift and pull out the flat-type semiconductor device 1 to be replaced, and insert a new flat-type semiconductor device 1. With the size and weight of the flat-type semiconductor devices 1 increasing nowadays, a large force or a dedicated jig is needed for lifting each flat-type semiconductor device 1. Furthermore, there is an increased risk of damaging the flat-type semiconductor device 1 by the center pins 3 when replacing it, resulting in a significant deterioration in reliability of the flat-type semiconductor device 1.

The flat-type semiconductor devices 1 and the heat-radiating elements 2 are positioned by visually aligning the center pins 3 and the positioning holes 3a. As a result of the increase in size of the flat-type semiconductor devices 1, their central positions have become distant from the viewpoint of a worker, and this makes it difficult and time-consuming to carry out position alignment work. In addition, if the gaps between one flat-type semiconductor device 1 and the heat-radiating elements 2 are eliminated before their centers are accurately aligned, the flat-type semiconductor device 1 or the adjacent heat-radiating elements 2 could be damaged, resulting in a deterioration of electrical performance of the flat-type semiconductor device 1 or of heat-dissipating performance of the heat-radiating elements 2.

SUMMARY OF THE INVENTION

This invention has been made to provide a solution to the aforementioned problems of the prior art. Specifically, it is an object of the invention to provide a flat-type semiconductor stack which requires reduced space allowance that enables a flat-type semiconductor device and its adjacent heat-radiating element to be moved for making a gap between them, wherein the flat-type semiconductor device and the heat-radiating element can be accurately and easily aligned with reduced risk of physical damages.

According to the invention, a flat-type semiconductor stack, which is formed by alternately stacking flat-type semiconductor devices and heat-radiating elements and pressurizing them in their stacking direction, comprises a position alignment mechanism for aligning contact surfaces of at least one each flat-type semiconductor device and heat-radiating element. The position alignment mechanism achieves alignment of the contact surfaces of the aforesaid one each flat-type semiconductor device and heat-radiating element by allowing the flat-type semiconductor device to slide along the heat-radiating element in a direction perpendicular to the stacking direction and stopping sliding motion of the flat-type semiconductor device at a positioning part.

This construction makes it easy to accurately align the flat-type semiconductor device and the heat-radiating element and to replace the flat-type semiconductor device when the need arises.

In one form of the invention, the position alignment mechanism includes a projecting pin provided on the contact surface of the flat-type semiconductor device or the heat-radiating element, a positioning hole in which the pin is fitted, the positioning hole being formed in the contact surface of the flat-type semiconductor device or the heat-radiating element whichever unprovided with the pin, and a guide groove formed in the same contact surface as the positioning hole, the guide groove extending directly from the positioning hole to a side surface of the flat-type semiconductor device or the heat-radiating element in which the positioning hole is formed.

In this construction, it is possible to accurately align the flat-type semiconductor device and the heat-radiating element by placing the pin in the guide groove and sliding the pin along the guide groove until the pin fits in he positioning hole. This construction also makes it possible to decrease the space allowance that enables the flat type semiconductor device and the heat-radiating element to be moved for making a gap between them and to reduce the risk of damaging them. In addition, the flat-type semiconductor device can be easily replaced in this construction.

In another form of the invention, at least one of the flat-type semiconductor devices is a gate-integrated flat-type semiconductor device formed by mounting a semiconductor element on a substrate together with a gate circuit, herein the position alignment mechanism includes a projecting pin provided on a contact surface of the substrate, a positioning hole in which the pin is fitted, the positioning hole being formed in the contact surface of the heat-radiating element, and a guide groove formed in the contact surface of the heat-radiating element, the guide groove extending directly from the positioning hole to a side surface of the heat-radiating element.

In this construction, it is possible to accurately align the gate-integrated flat-type semiconductor device and the heat-radiating element by placing the pin in the guide groove and sliding the pin along the guide groove until the pin fits in the positioning hole. This construction also makes it possible to decrease the space allowance that enables the gate-integrated flat-type semiconductor device and the heat-radiating element to be moved for making a gap between them and to reduce the risk of damaging them. In addition, the gate-integrated flat-type semiconductor device can be easily replaced in this construction.

In a varied form of the invention, at least one of the flat-type semiconductor devices is a gate-integrated flat-type semiconductor device formed by mounting a semiconductor element on a substrate together with a gate circuit, wherein the position alignment mechanism includes a projecting pin provided on the contact surface of the heat-radiating element, a positioning hole in which the pin is fitted, the positioning hole being formed in the substrate, and a guide groove formed in the substrate, the guide groove extending directly from the positioning hole to a side surface of the substrate.

In the construction, it is possible to accurately align the gate-integrated flat-type semiconductor device and the heat-radiating element by placing the pin in the guide groove and sliding the pin along the guide groove until the pin fits in the positioning hole. This construction also makes it possible to decrease the space allowance that enables the gate-integrated flat-type semiconductor device and the heat-radiating element to be moved for making a gap between them and to reduce the risk of damaging them. In addition, the gate-integrated flat-type semiconductor device can be easily replaced in this construction.

The position alignment mechanism may include a plurality of pins provided on one contact surface and a plurality of positioning holes and guide grooves formed in the opposite contact surface.

This construction makes it possible to avoid angular displacement and align the flat-type semiconductor device (gate-integrated flat-type semiconductor device) and the heat-radiating element more accurately.

In another varied form of the invention, at least one of the flat-type semiconductor devices is a gate-integrated flat-type semiconductor device formed by mounting a semiconductor element on a substrate together with a gate circuit, wherein the position alignment mechanism includes a groove formed in the contact surface of the heat-radiating element that comes in contact with a bottom surface of the substrate, the groove allowing the substrate to be fitted in from its side surface, and an end wall of the groove serving as the positioning part.

In this construction, it is possible to align the gate-integrated flat-type semiconductor device and the heat-radiating element more accurately and easily by sliding the substrate and fitting it in the groove in the heat-radiating element. This construction also makes it possible to decrease the space allowance that enables the gate-integrated flat-type semiconductor device and the heat-radiating element to be moved for making a gap between them and to reduce the risk of damaging them. In addition, the gate-integrated flat-type semiconductor device can be easily replaced in this construction.

In still another form of the invention, at least one of the flat-type semiconductor devices is a gate-integrated flat-type semiconductor device formed by mounting a semiconductor element on a substrate together with a gate circuit, wherein the position alignment mechanism includes a positioning plate for aligning an end portion of the heat-radiating element, the positioning plate being provided on a bottom surface of the substrate.

In this construction, it is possible to align the gate-integrated flat-type semiconductor device and the heat-radiating element more accurately and easily by sliding the substrate and securing the end portion of the heat-radiating element by the positioning plate. This construction also makes it possible to decrease the space allowance that enables the gate-integrated flat-type semiconductor device and the heat-radiating element to be moved for making a gap between them and to reduce the risk of damaging them. In addition, the gate-integrated flat-type semiconductor device can be easily replaced in this construction.

In yet another form of the invention, at least one of the flat-type semiconductor devices is a gate-integrated flat-type semiconductor device formed by mounting a semiconductor element on a substrate together with a gate circuit, wherein the position alignment mechanism includes a plurality of pins which serve as the positioning part for aligning an end portion of the heat-radiating element, the pins being provided on a bottom surface of the substrate.

In this construction, it is possible to align the gate-integrated flat-type semiconductor device and the heat-radiating element more accurately and easily by sliding the substrate and securing the end portion of the heat-radiating element by the multiple pins. This construction also makes it possible to decrease the space allowance that enables the gate-integrated flat-type semiconductor device and the heat-radiating element to be moved for making a gap between them and to reduce the risk of damaging them. In addition, the gate-integrated flat-type semiconductor device can be easily replaced in this construction.

These and other objects, features and advantages of the invention will become more apparent upon reading the following detailed description in conjunction with the accompanying drawings.

DETAILED DESCRIPTION OF THE PREFERRED EMBODIMENTS OF THE INVENTION

Specific embodiments of the invention are now described in detail referring to the drawings.

First Embodiment

Figure 1A:
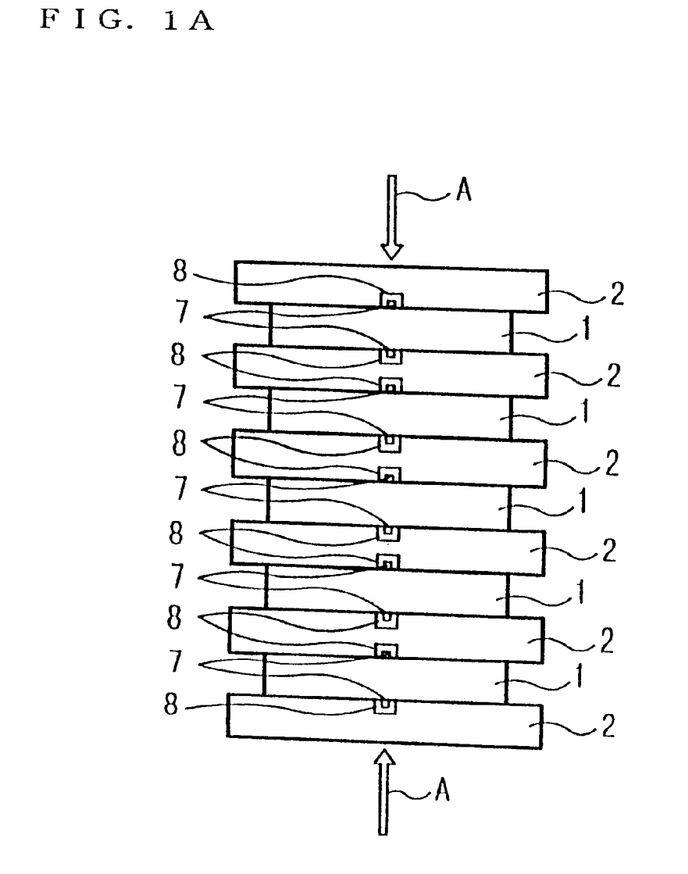
FIG. 1A is a side view of a flat-type semiconductor stack according to a first embodiment of the invention, showing in particular how its individual elements are stacked.
Figure 1B:
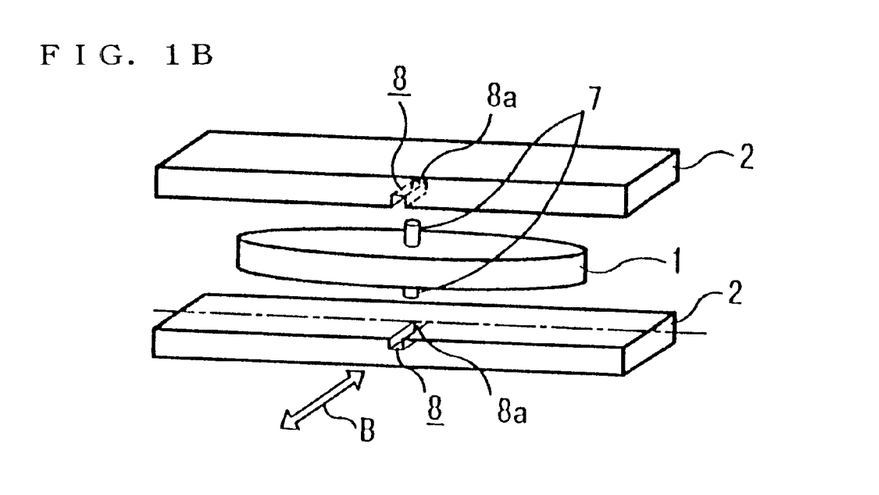
FIG. 1B is a perspective view showing a mechanism for aligning flat-type semiconductor devices and heat-radiating elements of the flat-type semiconductor stack of FIG. 1A.

FIG 1A is a side view of a flat-type semiconductor stack according to a first embodiment of the invention, showing in particular how its individual elements are stacked, and FIG. 1B is a perspective view showing a mechanism for aligning flat-type semiconductor devices 1 and heat-radiating elements 2 of the flat-type semiconductor stack of FIG. 1A. FIG. 1B shows one flat-type semiconductor device 1 and two heat-radiating elements 2 which are illustrated as if separated from one another for the sake of easy understanding of their stacking structure.

Specific numbers of the flat-type semiconductor devices 1 the heat-radiating elements 2 for cooling the flat-type semiconductor devices 1 are alternately stacked as depicted in FIG. 1A, and they are pressurized in their stacking direction from both ends (show n by arrows A). As can be seen from FIGS. 1A and 1B, a projecting center pin 7 is fixed to the center of each contact surface of the flat-type semiconductor devices 1, while a positioning recess 8a in which the center pin 7 is fitted and a guide groove 8 are formed in a corresponding contact surface of each heat-radiating element 2, the guide groove 8 extending directly from the positioning recess 8a to a side surface of the heat-radiating element 2. The positioning recess 8a is formed as an integral part of the guide groove 8. In this structure the positioning recess 8a located on a center line of the contact surface of each heat-radiating element 2 is formed at a terminal end of the guide groove 8 which opens at one side surface of the heat-radiating element 2. The center pin 7 is provided on each contact surface of the flat-type semiconductor devices 1 while the positioning recess 8a and the guide groove 8 are formed in each contact surface of the heat-radiating elements 2, in such a way that each center pin 7 aligns with its corresponding positioning recess 8a when the flat-type semiconductor devices 1 and the heat-radiating elements 2 are set in their stacking positions. The depths of the guide grooves 8 and the positioning recesses 8a are made slightly larger than the height of the center pins 7 projecting from the contact surfaces of the individual flat-type semiconductor devices 1.

The flat-type semiconductor stack of the above-described structure is assembled as described below. Referring to FIG. 1B, the center pins 7 provided on the contact surfaces of the flat-type semiconductor device 1 are first placed in the guide grooves 8 formed in the upper and lower heat-radiating elements 2, and the flat-type semiconductor device 1 is moved into a space between the heat-radiating elements 2 in the direction shown by an arrow B while sliding the center pins 7 along the guide grooves 8. Since the positioning recesses 8a are made at the terminal ends of the guide grooves 8, the center pins 7 stop to slide when they reach the positioning recesses 8a, where the center pins 7 fit into the respective positioning recesses 8a. The flat-type semiconductor device 1 and the heat-radiating elements 2 are accurately and easily aligned in this way.

The individual flat-type semiconductor device 1 is slid in the aforementioned manner in the direction of the arrow B which is perpendicular to the stacking direction of the flat-type semiconductor device 1 and the heat-radiating elements 2. The aforementioned sliding action stops when the center pin 7 reaches the positioning recess 8a at the terminal end of each guide groove 8, wherein the positioning recess 8a works as a stopper. The flat-type semiconductor device 1 and the heat-radiating elements 2 go into contact with one another when the center pins 7 provided on the flat-type semiconductor device 1 are fitted into the respective positioning recesses 8a.

When it becomes necessary to remove one of the flat-type semiconductor devices 1 for replacement after the flat-type semiconductor stack has been completed, the flat-type semiconductor device 1 to be replaced is moved along the direction of the arrow B by sliding the center pins 7 along the guide grooves 8 and removed from the flat-type semiconductor stack.

The center pins 7 can slide along the respective guide grooves 8 not only when inserting and aligning any flat-type semiconductor device 1 in between the heat-radiating elements 2, but also when pulling the flat-type semiconductor device 1 to be replaced out of the flat-type semiconductor stack as described above if only a pressure applied in the stacking direction is removed. Therefore, it is not necessary to provide any extra gap between the flat-type semiconductor devices 1 and the heat-radiating elements 2. This structure makes it possible to slide the flat-type semiconductor device 1 having an increased size and weight without lifting it and serves to avoid damaging the flat-the semiconductor device 1 and the heat-radiating elements 2.

While the center pins 7 are provided on the flat-type semiconductor devices 1 and the positioning recesses 8a and the guide grooves 8 are formed in the heat-radiating elements 2 in the above-described first embodiment, the invention is not limited to this structure. As an alternative, the embodiment may be modified such that the center pins 7 are provided on the heat-radiating elements 2 and the positioning recesses 8a and the guide grooves 8 are formed in the flat-type semiconductor devices 1.

Second Embodiment

Figure 2:
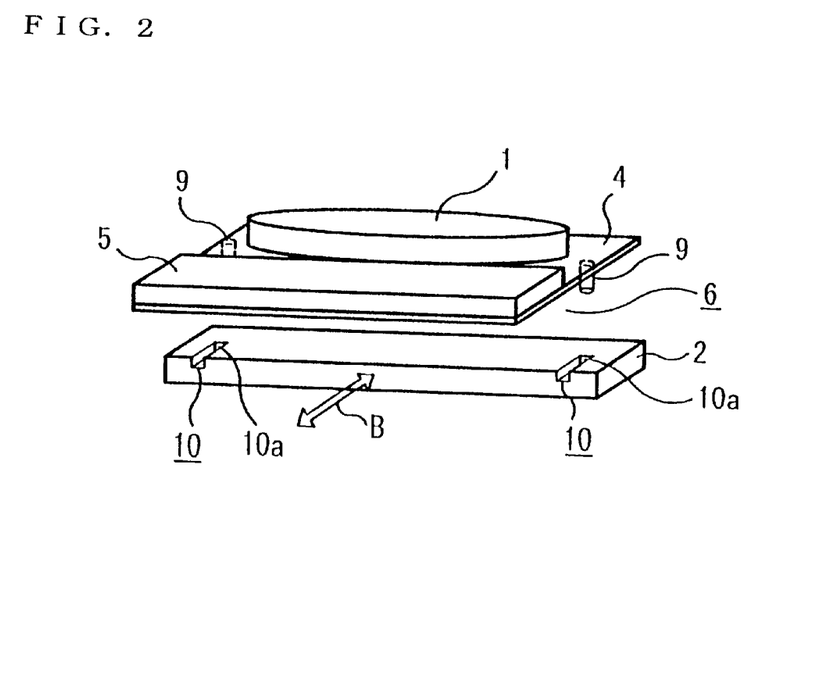
FIG. 2 is a perspective view showing a mechanism for aligning a gate-integrated flat-type semiconductor device and a heat radiating element of a flat-type semiconductor stack according to a second embodiment of the invention.

FIG. 2 is a perspective view showing a mechanism for aligning a flat-type semiconductor device 1 and a heat-radiating element 2 of a flat-type semiconductor stack according to a second embodiment of the invention. In this embodiment, the flat-type semiconductor device 1 and a gate circuit 5 or driving the flat-type semiconductor device 1 are mounted on a single substrate 4, together forming a gate-integrated flat-type semiconductor device 6 as illustrated. The following description of the present embodiment deals with alignment of a bottom side of the gate-integrated flat-type semiconductor device 6, or the bottom of the substrate 4, and the heat-radiating element 2 immediately beneath the gate-integrated flat-type semiconductor device 6. In FIG. 2, the heat-radiating element 2 and the substrate 4 are illustrated as if separated from each other for the sake of easy understanding of their stacking structure.

Referring to FIG. 2, projecting pins 9 are fixed to the bottom (contact surface) of the substrate 4 at specific positions, while positioning recesses 10a in which the pins 9 are fitted and guide grooves 10 are formed in a top contact surface of the heat-radiating element 2, the guide grooves 10 extending directly from the respective positioning recesses 10a to a side surface of the heat-radiating element 2. Each positioning recess 10a is formed as an integral part of the guide groove 10. In this structure, the positioning recess 10a is formed at a terminal end of each guide groove 10 which opens at one side surface of the heat-radiating element 2. In this embodiment, there are provided two each pins 9, positioning recesses 10a and guide grooves 10 in boundary areas of the contact surfaces of the substrate 4 and the heat-radiating element 2. The two guide grooves 10 are formed parallel to each other in a direction of guiding the gate-integrated flat-type semiconductor device 6.

The depths of the guide grooves 10 and the positioning recesses 10a are made slightly larger than the height of the pins 9 projecting from the bottom of the substrate 4.

The flat-type semiconductor stack of this embodiment is assembled as described below. The pins 9 provided on the bottom contact surface of the substrate 4 are placed in the guide grooves 10 formed in the top contact surface of the heat-radiating element 2, and the gate-integrated flat-type semiconductor device 6 is moved in the direction shown by an arrow B while sliding the pins 9 along the guide grooves 10. Since the positioning recesses 10a are made at the terminal ends of the guide grooves 10, the pins 9 stop to slide when they reach the positioning recesses 10a, where the pins 9 fit into the respective positioning recesses 10a. The flat-type semiconductor device 1 and the heat-radiating element 2 are accurately and easily aligned in this way.

When it becomes necessary to remove the gate-integrated flat-type semiconductor device 6, it is moved along the direction of the arrow B by sliding the pins 9 along the guide grooves 10 and removed from the flat-type semiconductor stack.

The pins can slide along the respective guide grooves 10 if only a pressure applied in the stacking direction is removed in this embodiment as well. Therefore, it is not necessary to provide any extra gap between the heat-radiating element 2 and the gate-integrated flat-type semiconductor device 6. This structure makes it possible to slide the gate-integrated flat-type semiconductor device 6 having an increased size and weight without lifting and serves to avoid damaging the gate-integrated flat-type semiconductor device 6 and the heat-radiating element 2.

While two each pins 9, positioning recesses 10a and guide grooves 10 are provided in this embodiment, their numbers may be decreased to one or increased to three or more. An advantage of the provision of more than one each pin 9, positioning recess 10a and guide groove 10 is that it becomes possible to exactly align the angular positions of the gate-integrated flat-type semiconductor device 6 and the heat-radiating element 2 and thereby achieve a higher accuracy of alignment with increased reliability.

The foregoing discussion of the present embodiment has dealt with the mechanism for aligning the gate-integrated flat-type semiconductor device 6 with the heat-radiating element 2 provided immediately beneath it. For aligning the gate-integrated flat-type semiconductor device 6 with a heat-radiating element 2 immediately above, pins 9 are provided on a top surface of the substrate 4 and positioning recesses 10a and guide grooves 10 are formed in a bottom contact surface of the upper heat-radiating element 2. In this latter structure, the pins 9 are provided in free areas of the top surface of the substrate 4, excluding its areas where the flat-type semiconductor device 1 an the gate circuit 5 are mounted, and are more projected by as much as the thickness of the flat-type semiconductor device 1 compared to the pins 9 provided on the bottom of the substrate 4. In addition, all the guide grooves 10 formed in the heat-radiating elements 2 stacked immediately above and beneath the gate-integrated flat-type semiconductor device 6 are made parallel to the direction of guiding the gate-integrated flat-type semiconductor device 6.

As an alternative approach, the earlier-described position alignment mechanism of the first embodiment may be applied to the aforementioned mechanism for aligning the gate-integrated flat-type semiconductor device 6 with the heat-radiating element 2 provided immediately above. Specifically, there may be provided a center pin 7 at the center of an upper contact surface of the flat-type semiconductor device 1 mounted on the substrate 4 with a positioning recess 8a and a guide groove 8 formed in the bottom contact surface of the upper heat-radiating element 2, the guide groove 8 extending directly from the positioning recess 8a to a side surface of the upper heat-radiating element 2. In this structure as well, all the guide grooves 8, 10 formed in the heat-radiating elements 2 stacked above and beneath the gate-integrated flat-type semiconductor device 6 are made parallel to the direction of guiding the gate-integrated flat-type semiconductor device 6.

Third Embodiment

Figure 3:
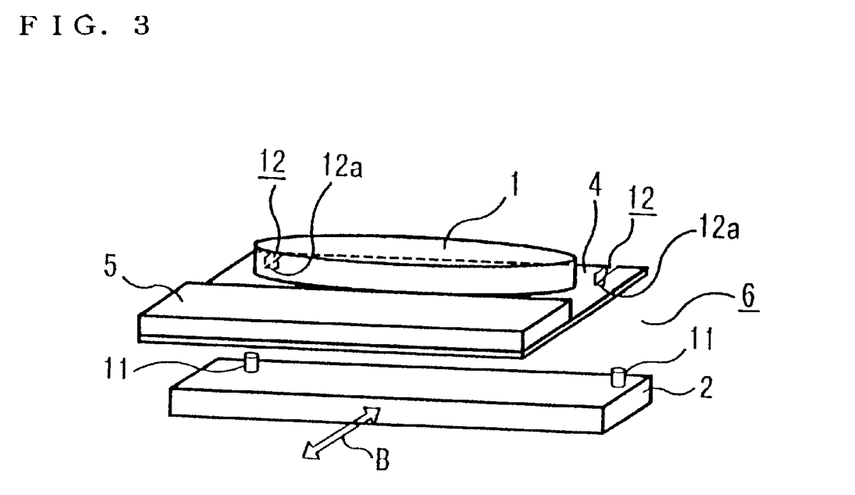
FIG. 3 is a perspective view showing a mechanism for aligning a gate-integrated flat-type semiconductor device and a heat radiating element in a flat-type semiconductor stack according to a third embodiment of the invention.

While the pins 9 are provided on the substrate 4 of the gate-integrated flat-type semiconductor device 6 in the above-described second embodiment, pins may be provided on the heat-radiating element 2. FIG. 3 is a perspective view showing a mechanism for aligning a bottom side of a gate-integrated flat-type semiconductor device 6, or the bottom of a substrate 4, with a heat-radiating element 2 in a flat-type semiconductor stack according to a third embodiment of the invention. In FIG. 3, the heat-radiating element 2 and the substrate 4 are illustrated as if separated from each other for the sake of easy understanding of their stacking structure.

Referring to FIG. 3, projecting pins 11 are fixed to the top (contact surface) of the heat-radiating element 2 at specific positions, while positioning holes 12a in which the pins 11 are fitted and guide grooves 12 are formed in a bottom contact surface of the gate-integrated flat-type semiconductor device 6, the guide grooves 12 extending directly from the respective positioning holes 12a to a side surface of the substrate 4. Each positioning hole 12a is formed as an integral part of the guide groove 12 in a free area of the substrate 4 excluding its areas where a flat-type semiconductor device 1 and a gate circuit 5 are mounted. The positioning hole 12a is formed at a terminal end of each guide groove 12 which opens at one side surface of the substrate 4.

The flat-type semiconductor stack of this embodiment is assembled as described below. The pins 11 are placed in the guide grooves 12 formed in the substrate 4, and the gate-integrated flat-type semiconductor device 6 is moved in the direction shown by an arrow B while sliding the pins 11 along the guide grooves 12. This mechanism makes it possible to easily align the gate-integrated flat-type semiconductor device 6 with the heat-radiating element 2 and remove the gate-integrated flat-type semiconductor device 6 from the flat-type semiconductor stack for replacement, so that the present embodiment produces the same effect as the aforementioned second embodiment.

For aligning the gate-integrated flat-type semiconductor device 6 with a heat-radiating element 2 immediately above, pins 11 are provided on a bottom contact surface of the upper heat-radiating element 2. The pins 11 on the bottom of the upper heat-radiating element 2 are more projected by as much as the thickness of the flat-type semiconductor device 1 compared to the pins 9 provided on the top of the lower heat-radiating element 2. In this stacking structure, guide grooves 12, in which the pins 11 on the bottom of the upper heat-radiating element 2 are fitted, are formed in a top contact surface of the gate-integrated flat-type semiconductor device 6 in such a manner that these guide grooves 12 do not overlap the guide grooves 12 for inserting the pins 11 on the top contact surface of the heat-radiating element 2 immediately below.

As an alternative approach, the earlier-described position alignment mechanism of the first or second embodiment may be applied to the aforementioned mechanism for aligning the gate-integrated flat-type semiconductor device 6 with the heat-radiating element 2 immediately above.

Fourth Embodiment

Figure 4:
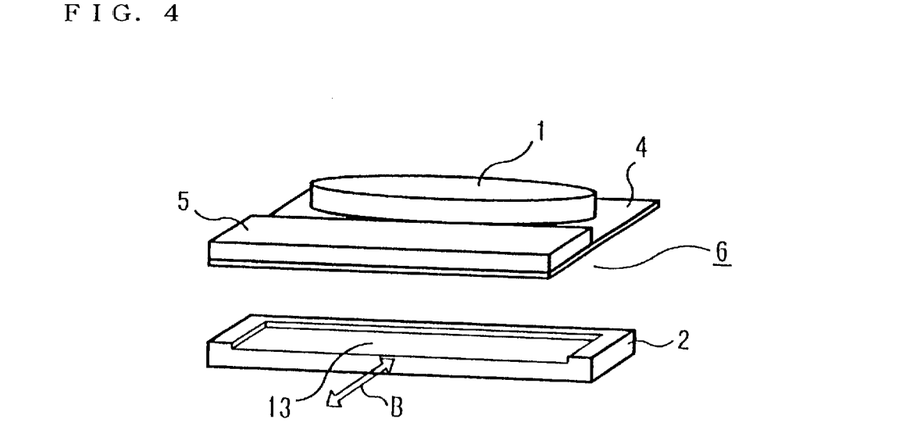
FIG. 4 is a perspective view showing a mechanism for aligning a gate-integrated flat-type semiconductor device and a heat-radiating element of a flat-type semiconductor stack according to a fourth embodiment of the invention.

FIG. 4 is an exploded perspective view showing a mechanism for aligning a bottom side of a gate-integrated flat-type semiconductor device 6, or the bottom of a substrate 4, with a heat-radiating element 2 in a flat-type semiconductor stack according to a fourth embodiment of the invention. In FIG. 4, the heat-radiating element 2 and the substrate 4 are illustrated as if separated from each other for the sake of easy understanding of their stacking structure.

As shown in FIG. 4, a groove 13 for fitting the substrate 4 from a side surface of the heat-radiating element 2 is formed in its upper contact surface.

In this embodiment, a side surface of the substrate 4 is aligned with the groove 13 at the side surface of the heat-radiating element 2 and the gate-integrated flat-type semiconductor device 6 (substrate 4) is slid in the direction shown by an arrow B to fit the substrate 4 into the groove 13. The substrate 4 stops to slide when it comes into contact with an end wall of the groove 13, whereby a flat-type semiconductor device 1 and the heat-radiating element 2 are accurately and easily aligned. It is possible to remove the gate-integrated flat-type semiconductor device 6 from the flat-type semiconductor stack for replacement by sliding the gate-integrated flat-type semiconductor device 6 (substrate 4) along the groove 13 in the heat-radiating element 2 in the opposite direction.

With this arrangement, the fourth embodiment produces the same effect as the aforementioned second embodiment and, in addition, the provision of the groove 13 shaped to match the external shape of the substrate 4 serves to avoid displacement of the gate-integrated flat-type semiconductor device 6.

Fifth Embodiment

Figure 5:
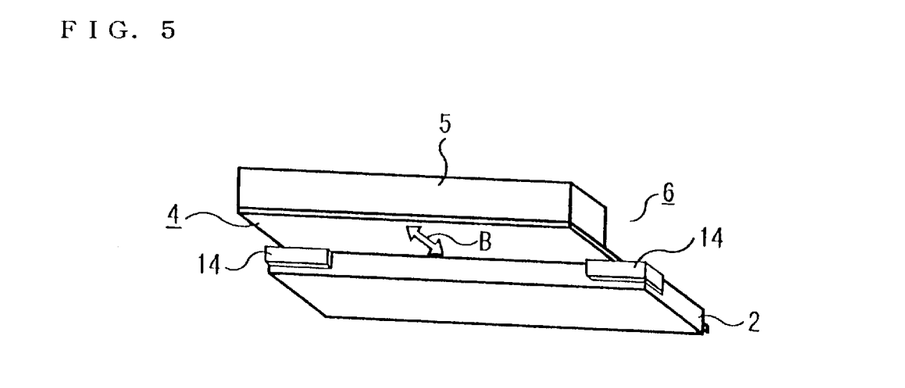
FIG. 5 is a perspective view showing a mechanism for aligning a gate-integrated flat-type semiconductor device and a heat-radiating element of a flat-type semiconductor stack according to a fifth embodiment of the invention.

FIG. 5 is a perspective view showing a mechanism for aligning a bottom side of a gate-integrated flat-type semiconductor device 6, or the bottom of a substrate 4, with a heat-radiating element 2 in a flat-type semiconductor stack according to a fifth embodiment of the invention. This perspective view shows a structure as seen obliquely from underneath the substrate 4 which is already aligned with the heat-radiating element 2.

As shown in FIG. 5, two L-shaped plates 14 serving as positioning plates, in which corners of the heat-radiating element 2 are fitted, are fixed to the bottom of the substrate 4.

In this embodiment, one end of the substrate 4 is placed on the heat-radiating element 2 and the gate-integrated flat-type semiconductor device 6 (substrate 4) is slid in the direction shown by an arrow B. The substrate 4 stops to slide when the corners of the heat-radiating element 2 come into contact with and fit in the two L-shaped plates 14, whereby a flat-type semiconductor device 1 and the heat-radiating element 2 are accurately and easily aligned. It is also possible to remove the gate-integrated flat-type semiconductor device 6 from the flat-type semiconductor stack for replacement by sliding the gate-integrated flat-type semiconductor device 6 (substrate 4) along the heat-radiating element 2 in the opposite direction.

With this arrangement, the fifth embodiment produces the same effect as the aforementioned second embodiment and, in addition, this embodiment provides a low-cost position alignment mechanism which serves to avoid displacement of the gate-integrated flat-type semiconductor device 6.

It is to be pointed out that the positioning plates need not necessarily be L-shaped. As an example, each of the L-shaped plates 14 may be replaced by two separate flat plates fitted at right angles to each other.

Figure 6:
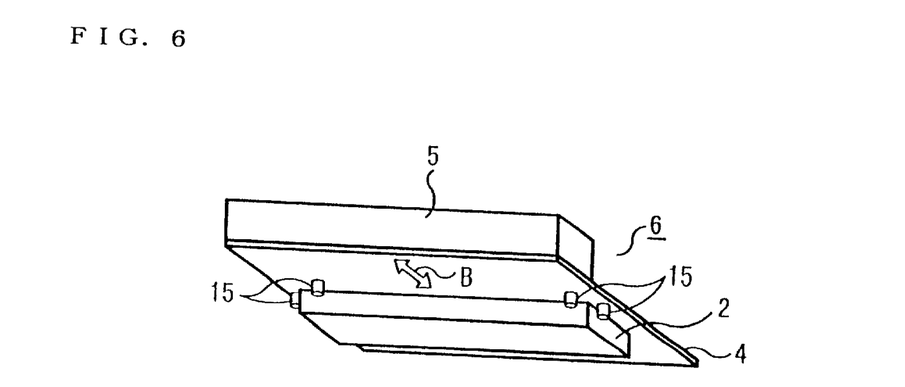
FIG. 6 is a perspective view showing a mechanism for aligning a gate-integrated flat-type semiconductor device and a heat-radiating element of a flat-type semiconductor stack in one varied form of the fifth embodiment of the invention.

If the heat-radiating element 2 is shorter than the substrate 4 as shown in FIG. 6, a plurality of positioning pins 15 may be provided on the bottom of the substrate 4 instead of the L-shaped plates 14 so that the corners of the heat-radiating element 2 are secured in position by the positioning pins 15. This structure would enable fine adjustment as well as correction of the location of the heat-radiating element 2 by machining the corners of the heat-radiating element 2.

While the foregoing description of the fourth and fifth embodiments has dealt with the mechanisms for aligning the gate-integrated flat-type semiconductor device 6 with the heat-radiating element 2 provided immediately beneath, the mechanisms described in connection with the first to third embodiments may be applied to alignment of the gate-integrated flat-type semiconductor device 6 with a heat-radiating element 2 provided immediately above it.

What is claimed is:

1. A flat-type semiconductor stack formed by alternately stacking flat-type semiconductor devices and heat-radiating elements and pressurizing them in their stacking direction, the flat-type semiconductor stack comprising a position alignment mechanism for aligning contact surfaces of at least one each flat-type semiconductor device and heat-radiating element, wherein the position alignment mechanism achieves alignment of the contact surfaces of said one each flat-type semiconductor device and heat-radiating element by allowing the flat-type semiconductor device to slide along the heat-radiating element in a direction perpendicular to the stacking direction and stopping sliding motion of the flat-type semiconductor device at a positioning part.

2. The flat-type semiconductor stack according to claim 1, wherein said position alignment mechanism includes:
   a projecting pin provided on the contact surface of the flat-the semiconductor device or the heat-radiating element;
   a positioning hole in which the pin is fitted, the positioning hole being formed in the contact surface of the flat-type semiconductor device or the heat-radiating element whichever unprovided with the pin; and
   a guide groove formed in the same contact surface as the positioning hole, the guide groove extending directly from the positioning hole to a side surface of the flat-type semiconductor device or the heat-radiating element in which the positioning hole is formed.

3. The flat-type semiconductor stack according to claim 1, wherein at least one of said flat-type semiconductor devices is a gate-integrated flat-type semiconductor device formed by mounting a semiconductor element on a substrate together with a gate circuit, and wherein said position alignment mechanism includes:
   a projecting pin provided on a contact surface of the substrate;
   a positioning hole in which the pin is fitted, the positioning hole being formed in the contact surface of the heat-radiating element; and
   a guide groove formed in the contact surface of the heat-radiating element, the guide groove extending directly from the positioning hole to a side surface of the heat-radiating element.

4. The flat-type semiconductor stack according to claim 1, wherein at least one of said flat-type semiconductor devices is a gate-integrated flat-type semiconductor device formed by mounting a semiconductor element on a substrate together with a gate circuit, and wherein said position alignment mechanism includes:
   a projecting pin provided on the contact surface of the heat-radiating element;
   a positioning hole in which the pin is fitted, the positioning hole being formed in the substrate; and
   a guide groove formed in the substrate, the guide groove extending directly from the positioning hole to a side surface of the substrate.

5. The flat-type semiconductor stack according to claim 2, wherein said position alignment mechanism includes a plurality of pins provided on one contact surface and a plurality of positioning holes and guide grooves formed in the opposite contact surface.

6. The flat-type semiconductor stack according to claim 1, wherein at least one of said flat-type semiconductor devices is a gate-integrated flat-type semiconductor device formed by mounting a semiconductor element on substrate together with a gate circuit, and wherein said position alignment mechanism includes a groove formed in the contact surface of the heat-radiating element that comes in contact with a bottom surface of the substrate, the groove allowing the substrate to be fitted in from its side surface, and an end wall of the groove serving as the positioning part.

7. The flat-type semiconductor stack according to claim 1, wherein at least one of said flat-type semiconductor devices is a gate-integrated flat-type semiconductor device formed by mounting a semiconductor element on a substrate together with a gate circuit, and wherein said position alignment mechanism includes a positioning plate for aligning an end portion of the heat-radiating element, said positioning plate being provided on a bottom surface of the substrate.

8. The flat-type semiconductor stack according to claim 1, wherein at least one of said flat-type semiconductor devices is a gate-integrated flat-type semiconductor device formed by mounting a semiconductor element on a substrate together with a gate circuit, and wherein said position alignment mechanism includes a plurality of pins which serve as the positioning part for aligning an end portion of the heat-radiating element, said pins being provided on a bottom surface of the substrate.

* * * * *